(12) United States Patent
Albert et al.

(10) Patent No.: US 6,494,088 B2
(45) Date of Patent: Dec. 17, 2002

(54) CONTROL DEVICE IN A MOTOR VEHICLE AND A METHOD OF ATTACHING A PRESSURE SENSOR USED BY THE CONTROL DEVICE

(75) Inventors: Roland Albert, Regensburg (DE); Christian Fritzsche, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 44 days.

(21) Appl. No.: 09/771,888

(22) Filed: Jan. 29, 2001

(65) Prior Publication Data

US 2001/0011478 A1 Aug. 9, 2001

Related U.S. Application Data

(63) Continuation of application No. PCT/DE99/02001, filed on Jul. 1, 1999.

(30) Foreign Application Priority Data

Jul. 29, 1998 (DE) .......................................... 198 34 212

(51) Int. Cl.[7] .............................................. G01M 15/00
(52) U.S. Cl. ........................................ 73/118.1; 73/756
(58) Field of Search ................................. 73/116, 117.2, 73/117.3, 118.1, 700, 756

(56) References Cited

U.S. PATENT DOCUMENTS

| | | | |
|---|---|---|---|
| 4,580,128 A | 4/1986 | Ogita et al. | |
| 4,898,035 A | 2/1990 | Yajima et al. | |
| 5,025,683 A | 6/1991 | Lewis | |
| 6,003,381 A | * 12/1999 | Kato | ........................... 73/721 |
| 2001/0018380 A1 | * 8/2001 | Fritzsche et al. | ........... 475/116 |
| 2002/0062714 A1 | * 5/2002 | Albert et al. | .............. 74/606 R |

FOREIGN PATENT DOCUMENTS

| | | |
|---|---|---|
| DE | 1 962 383 | 6/1970 |
| DE | 295 13 950 U1 | 2/1997 |
| DE | 196 30 985 A1 | 3/1997 |
| DE | 297 14 229 U1 | 1/1998 |
| DE | 197 37 821 A1 | 3/1998 |
| EP | 0 238 846 A2 | 3/1986 |
| EP | 0 579 308 A1 | 1/1994 |
| FR | 2 026 040 | 9/1970 |

OTHER PUBLICATIONS

"Halbleiter–Schaltungstechnik, Achte, überarbeitete Auflage" (Tietze et al.), dated 1986, pp. 740–745, pertains to a semiconductor circuit engineering.

"1992 Data Converter Reference Manual, vol. 1", Analog Devices, pp. 2–371 –2–381 and 4–59 –4–74.

* cited by examiner

Primary Examiner—Eric S. McCall
(74) Attorney, Agent, or Firm—Laurence A. Greenberg; Werner H. Stemer; Ralph E. Locher

(57) ABSTRACT

The control device has a control circuit and a pressure sensor for measuring the hydraulic pressure in the gearbox. The control circuit and the pressure sensor are accommodated in a common housing. The housing has a metallic baseplate which is connected in a pressure tight fashion to a hydraulic unit of the gearbox and is provided with a bore hole through which pressure is applied to the pressure sensor. A carrier for the pressure sensor has a cylinder-like projection which is pressed into the bore hole in such a way that a pressure tight and frictionally locking connection is produced between the carrier and the baseplate as a result of the displacement of material. The pressure sensor can also be used to measure the intake vacuum of an engine.

7 Claims, 2 Drawing Sheets

CONTROL DEVICE IN A MOTOR VEHICLE AND A METHOD OF ATTACHING A PRESSURE SENSOR USED BY THE CONTROL DEVICE

CROSS-REFERENCE TO RELATED APPLICATION

This application is a continuation of copending International Application No. PCT/DE99/02001, filed Jul. 1, 1999, which designated the United States.

BACKGROUND OF THE INVENTION

Field of the Invention

The present invention lies in the automotive technology invention relates to a control device in a motor vehicle, in particular for an automatic gearbox. The control device has at least one pressure sensor for measuring the hydraulic pressure in the gearbox, a housing with a metallic baseplate which is connected in a pressure-tight fashion to a hydraulic unit of the gearbox and which is provided with a bore hole through which the pressure prevailing in the hydraulic unit is applied to the pressure sensor, an electronic control circuit which is electrically connected to the pressure sensor and is accommodated together with the pressure sensor in the housing, and a metallic carrier for the pressure sensor which has a cylinder-like projection. The invention further pertains to a method of attaching a pressure sensor for measuring a pressure in a fluid or gaseous medium in a motor vehicle to a baseplate.

Automatic gearboxes for passenger cars are predominantly electronically controlled. The electronic control receives and evaluates, inter alia, the signals from a plurality of sensors in the motor vehicle. Thus, the pressure of the hydraulic oil of the gearbox has to be measured using one or more sensors, specifically both in automatic stepped gearboxes and in stepless or CVT gearboxes. On the other hand, modern engine controllers evaluate the intake vacuum and, to do this require a pressure sensor accommodated in the intake tract.

The electronic gearbox controller is conventionally accommodated in a housing which protects it against environmental influences, also referred to as an electronic box. The hydraulic pressure is measured using one or more independent sensors which are electronically connected to the control electronics. In order to protect against the ambient medium (ATF gearbox oil) it is also necessary to pack the evaluation and control circuits tightly. Therefore, two separate housings are necessary which are connected to one another by means of electric leads, and these leads would have to be lead through the housing wall in a manner which is sealed against pressurized oil.

Advanced gearbox controllers are increasingly integrated into the gearbox housing (see German Gebrauchsmuster DE 295 13 950 U1). The electronic control circuit of such a control device is electrically connected to at least one sensor for measuring the hydraulic pressure in the gearbox (referred to in the following text as pressure sensor), the pressure sensor and the electronic control circuit being accommodated in a common housing and the pressure sensor being connected to a hydraulic unit of the gearbox through a bore hole.

A prior art gearbox controller for a motor vehicle has a baseplate which is arranged in a gearbox housing and which is made of metal with a bore hole in which a one-part component sensor housing 71 is attached by plugging in with a molded on knob (see German Gebrauchsmuster DE 297 14 229 U1). A pressure-tight connection of the housing to the baseplate is made by bonding, soldering or welding or the like. However, this does not provide a seal, but instead an O-ring is used which is held locked in an undercut groove at the end of the housing knob.

An air filter maintenance display device has a switch structure containing a diaphragm with which the pressure drop in a motor vehicle air filter is monitored and as a result an excessively high degree of contamination of the air filter is detected (see German patent application DE 196 30 985 A1). The switch structure is attached to the air filter by means of a socket. Such an attachment method is not suitable for sealing the hydraulic pressures occurring in a gearbox housing.

It is also known to automatically attach a bearing journal or bolt to a plate shaped workpiece (see French patent application FR 2 026 040). The bolt has a flat end face and an annular face which is arranged perpendicularly thereto and together they form a cutter. With this cutter, a circular opening into which the bolt is pressed using its annular face and a second annular face which is separated from the first by an annular groove, and thus attached is punched out of the workpiece. Alternatively the bolt is pressed into an existing bore hole using the aforethe annular faces. This all serves merely to attach the bolt. Ducts which conduct a hydraulic fluid, a high hydraulic pressure which is to be translated and the sealing problem occurring in this context are not mentioned in the publication.

SUMMARY OF THE INVENTION

It is accordingly an object of the invention to provide a control unit in a motor vehicle and a method of attaching a pressure sensor used by the control unit, which overcomes the above-mentioned disadvantages of the heretofore-known devices and methods of this general type. A particular object is to inexpensively seal the pressure sensor with respect to the pressure of the medium which is to be measured, in particular the high pressure prevailing in the gearbox-hydraulics. In addition, the sensor is to be sealed with respect to the space containing the electronic control circuit, i.e. with respect to the ambient pressure.

With the foregoing and other objects in view there is provided, in accordance with the invention, a control device in a motor vehicle, comprising:

a pressure sensor for measuring a hydraulic pressure in a gearbox;

a housing enclosing the pressure sensor, the housing having a metallic baseplate connected in a pressure-tight fashion to a hydraulic unit of the gearbox and formed with a bore hole through which the pressure prevailing in the hydraulic unit is applied to the pressure sensor;

an electronic control circuit electrically connected to the pressure sensor and accommodated in the housing; and a metallic carrier supporting the pressure sensor, the metallic carrier having a cylinder-like projection pressed into the bore hole such that a pressure-tight and frictionally locking connection is produced between the carrier and the baseplate as a result of a displacement of metallic materials having mutually different degrees of hardness.

In accordance with an added feature of the invention, the projection of the carrier is a two-step cylinder-like projection having a first step with a larger diameter than the bore hole of the baseplate, and a second step having a diameter corresponding to the diameter of the bore hole; and the projection is pressed into the bore hole such that a portion of a substance of the baseplate having been displaced by the first step has penetrated behind a shoulder formed by a junction between the first and second steps of the projection.

In accordance with an additional feature of the invention, an O-ring seals the baseplate against the hydraulic unit.

In accordance with another feature of the invention, the projection has an end facing away from the carrier formed with a radially protruding edge defining an annular groove together with the first part of the projection.

In accordance with a further feature of the invention, the carrier is composed of a hard metallic material and the baseplate is composed of a relatively softer material. In a preferred embodiment, the carrier is composed of steel and the baseplate is composed of aluminum.

With the above and other objects in view there is also provided, in accordance with the invention, a method of attaching a pressure sensor for measuring a pressure in a fluid or gaseous medium in a motor vehicle to a baseplate, which comprises mounting a pressure sensor on a metallic carrier formed with a cylinder-like projection and pressing the cylinder-like projection into a bore hole in the baseplate to thereby produce a pressure-tight and frictionally locking connection between the carrier and the baseplate as a result of a displacement of materials with different degrees of hardness.

In accordance with a concomitant feature of the invention, the metallic carrier is pressed into a baseplate composed of plastic in an intake tract of a motor vehicle engine. The assembly can then be utilized to measure an intake vacuum in the intake tract.

The advantages of the invention reside, inter alia, in the fact that the problems which occur when a plurality of pressure sensors with a radial high pressure seal by means of geometric overspecification are installed and the resulting lack of tightness are avoided.

Other features which are considered as characteristic for the invention are set forth in the appended claims.

Although the invention is illustrated and described herein as embodied in a control device in a motor vehicle and a method for attaching a pressure sensor used by it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
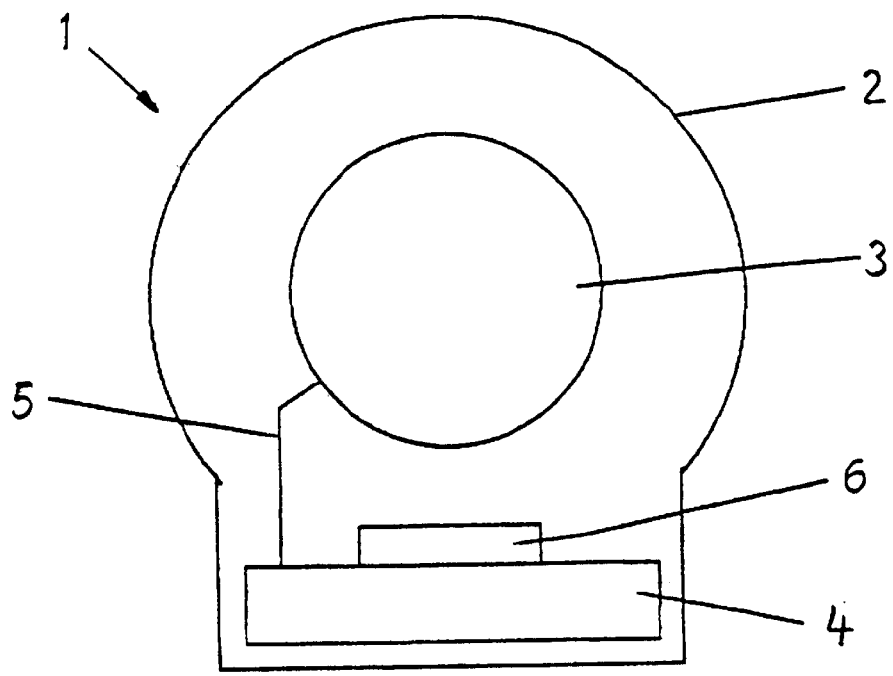
FIG. 1 is a schematic view of an automatic motor vehicle gearbox with a control device according to the invention integrated into the gearbox housing.

Referring now to the figures of the drawing in detail and first, particularly, to FIG. 1 thereof, there is shown an automatic gearbox 1 with a gearbox housing 2 that includes the components mentioned below. A transmission unit 3 activates various clutches, brakes and the like in the gearbox by means of hydraulic pressure and thus determines the gearbox transmission ratio (in a CVT gearbox) or engages the necessary gear speed (in a stepped gearbox).

The necessary hydraulic pressure is supplied to the transmission unit 3 by a hydraulic unit 4 via hydraulic lines. A control device 6 for the automatic gearbox is mounted on the hydraulic unit 4.

Figure 2:
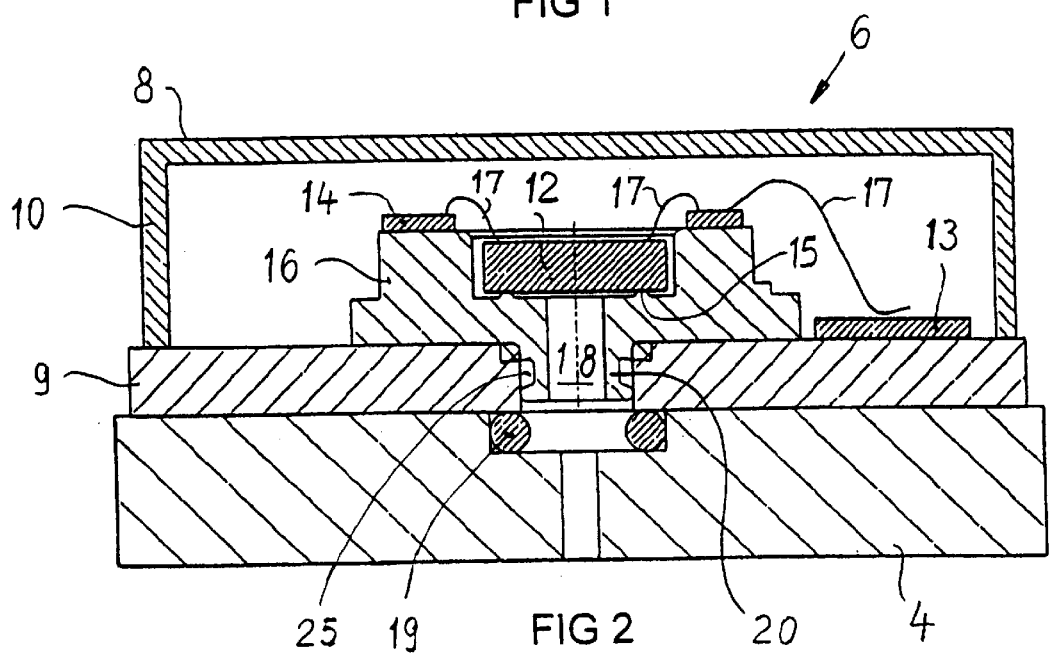
FIG. 2 is a sectional view of a control device according to the invention.

Referring now to FIG. 2, the control device 6 has a housing 8 which is composed of a metallic baseplate 9 and a box-shaped lid 10. The baseplate 9 can, however, also be covered in a pressure tight and fluid tight fashion, i.e. in particular tight with respect to pressurized gear lubricant oil (referred to below as pressurized oil tight), in another way. Accommodated in the interior of the housing are a pressure sensor for measuring hydraulic pressures, referred to below as pressure sensor 12, and a control circuit 13 which is arranged on a printed circuit board, for example.

The pressure sensor 12 may be of various designs, it is, for example, advantageously embodied as a conventional piezo resistive pressure sensor. A balancing circuit or evaluation circuit 14, which is embodied, for example, as a hybrid circuit, may also be accommodated in the housing 8. It is used as a signal amplifier and/or evaluator and has resistors, for example in the form of conductor tracks, which can be balanced and with which the evaluation circuit is matched to the pressure sensor 12 in terms of resistance.

The pressure sensor 12 is attached in a pressurized oil tight fashion to a metallic carrier 16 by means of a suitable connection means, for example by means of a welded connection 15, and is connected to the control circuit 13, and if appropriate to the hybrid circuit 14, by means of bonding wires 17.

The pressure which is to be measured, that is to say the pressure of the hydraulic oil in the gearbox 1, passes via a pressure duct in the form of a bore hole 18 which penetrates the carrier 16, the baseplate 9 and the wall of the hydraulic unit 4, to the underside of the pressure sensor 12. The joint between the surface of the hydraulic unit 4 and the underside of the baseplate 9 is sealed with an O-ring 19 which can be compressed axially.

Figure 3:
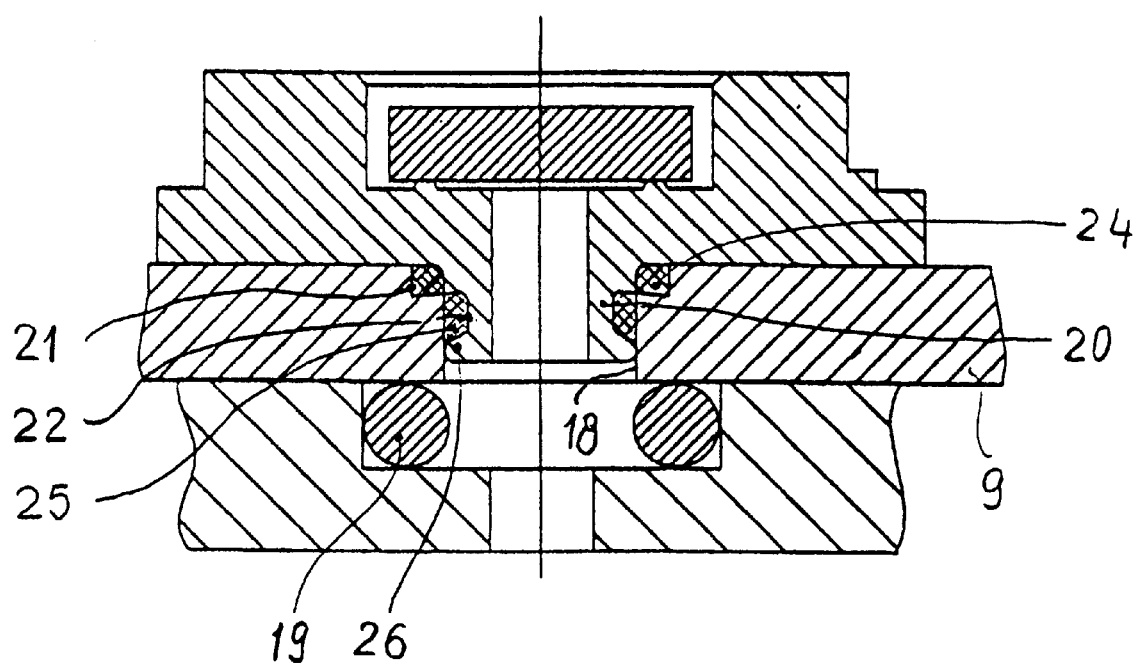
FIG. 3 is an enlarged sectional view of a detail of the control device according to FIG. 2.

The carrier 16 for the pressure sensor 12 is provided with a two step cylinder like projection 20—protruding downward in the drawing—(see also FIG. 3). A first step 21 of the projection has a larger diameter than the bore hole 18 of the baseplate 9, and a second step 22 has a diameter corresponding to the bore hole 18.

The carrier 16 is fabricated from a harder metal, for example from steel, than the baseplate 9, which is composed of aluminum, for example. Secure attachment of the pressure sensor carrier 16 to the baseplate 9 is achieved by producing a pressure tight and frictionally locking connection between the carrier and the baseplate by means of the displacement of material by pressing the projection 20 into the bore hole 18 of the baseplate in such a way that a portion of the substance of the baseplate 9 which has been displaced by its first step 21 penetrates behind a shoulder which is formed by the junction between the two steps 21, 22 of the projection 20. At this time, the substance of the baseplate flows out of an annular region 24 of the baseplate 9 into an annular groove 24 on the outer circumference of the second step 22 of the projection 20.

In FIG. 3 the annular region 24 and the annular groove 25 are illustrated with double hatching, while in FIG. 2 the annular groove 25 is illustrated without hatching in order to aid comprehension. The annular groove 25 is formed by the first step 21, the outer face of the second step 22 and by an edge 26 of the projection 20 which projects radially from its end facing away from the carrier 16.

The pressure sensor 12 can also be used for other purposes in a motor vehicle, for example for measuring the intake vacuum of the engine. The pressure sensor is then pressed into a baseplate which is composed of plastic and distributed in the intake tract of the engine. The evaluation circuit is connected to the engine controller or integrated into it. The intake tract, the engine and the engine controller are not illustrated here because they are generally known in various embodiments.

We claim:

1. A control device in a motor vehicle, comprising:

a pressure sensor for measuring a hydraulic pressure in a gearbox;

a housing enclosing said pressure sensor, said housing having a metallic baseplate connected in a pressure-tight fashion to a hydraulic unit of the gearbox and formed with a bore hole through which the pressure prevailing in the hydraulic unit is applied to said pressure sensor;

an electronic control circuit electrically connected to said pressure sensor and accommodated in said housing; and a metallic carrier supporting said pressure sensor, said metallic carrier having a cylinder-like projection pressed into said bore hole such that a pressure-tight and frictionally locking connection is produced between said carrier and said baseplate as a result of a displacement of metallic materials having mutually different degrees of hardness.

2. The control device according to claim 1, wherein said projection of said carrier is a two-step cylinder-like projection having a first step with a larger diameter than said bore hole of the baseplate, and a second step having a diameter corresponding to the diameter of said bore hole; and said projection is pressed into said bore hole such that a portion of a substance of said baseplate having been displaced by said first step has penetrated behind a shoulder formed by a junction between said first and second steps of the projection.

3. The control device according to claim 1, which comprises an O-ring sealing said baseplate against the hydraulic unit.

4. The control device according to claim 1, wherein said projection has an end facing away from said carrier formed with a radially protruding edge defining an annular groove together with the first part of said projection.

5. The control device according to claim 1, wherein said carrier is composed of a hard metallic material and said baseplate is composed of a relatively softer material.

6. The control device according to claim 1, wherein said carrier is composed of steel and said baseplate is composed of aluminum.

7. A control device in a motor vehicle, comprising:

a pressure sensor for measuring a fluid pressure in a motor vehicle;

a housing enclosing said pressure sensor, said housing having a metallic baseplate connected in pressure-tight fashion to a motor vehicle unit carrying the fluid to be measured, said baseplate having a bore hole formed therein through which said pressure sensor is exposed to the fluid pressure;

an electronic control circuit electrically connected to said pressure sensor and accommodated in said housing; and a metallic carrier supporting said pressure sensor, said metallic carrier having a cylinder-like projection pressed into said bore hole such that a pressure-tight and frictionally locking connection is produced between said carrier and said baseplate as a result of a displacement of metallic materials having mutually different degrees of hardness.

* * * * *